(12) United States Patent
Kim et al.

(10) Patent No.: US 6,487,693 B1
(45) Date of Patent: Nov. 26, 2002

(54) CHANNEL ENCODING/DECODING IN COMMUNICATION SYSTEM

(75) Inventors: Jae-Yeol Kim, Kunpo-shi (KR); Chang-Soo Park, Seoul (KR); Hee-Won Kang, Seoul (KR); Jun-Jin Kong, Songnam-shi (KR); Jong-Seon No, Songnam-shi (KR); Kyeong-Cheol Yang, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/369,626

(22) Filed: Aug. 6, 1999

(30) Foreign Application Priority Data

Aug. 6, 1998 (KR) .............................................. 98-32471

(51) Int. Cl.[7] ........................ H03M 13/27; H03M 13/45
(52) U.S. Cl. ...................................... 714/786; 714/780
(58) Field of Search ................................. 714/786, 780

(56) References Cited

U.S. PATENT DOCUMENTS

| | | | | |
|---|---|---|---|---|
| 5,436,918 A | * | 7/1995 | Kato et al. | 371/43 |
| 5,673,291 A | * | 9/1997 | Dent | 375/262 |
| 5,878,085 A | * | 3/1999 | McCallister et al. | 375/280 |
| 5,910,182 A | * | 6/1999 | Dent et al. | 714/786 |
| 5,944,849 A | * | 8/1999 | Sonetaka | 714/786 |
| 6,188,717 B1 | * | 2/2001 | Kaiser et al. | 375/148 |
| 6,192,501 B1 | * | 2/2001 | Hladik et al. | 714/786 |
| 6,272,183 B1 | * | 8/2001 | Berens et al. | 375/262 |

OTHER PUBLICATIONS

Berrou et al., "Near Shannon Limit Error–Correcting Coding and Decoding: Turbo–Codes (1)", ICC '93, May 1993, pp. 1064–1070.*

Wachsmann et al., "Power and Bandwidth Efficient Digital Communication Using Turbo Codes in Multilevel Codes", European Transactions on Telecommunications, vol. 6, No. 5, Sep./Oct. 1995, pp. 557–567.*

Ferry et al., "Turbo–Decoder Synchronization Procedure. Application to the CAS5093 Integrated Circuit", ICECS '96, Oct. 1996, pp. 168–171.*

Kaiser et al., "Optimal Detection when Combining OFDM–CDMA with Convolutional and Turbo Channel Coding", ICC '96, Jun. 1996, pp. 343–348.*

Jeng et al., "Performance of Turbo Codes in Multipath Fading Channels", VTC '98, May 1998, pp. 61–65.*

* cited by examiner

Primary Examiner—Stephen M. Baker
(74) Attorney, Agent, or Firm—Dilworth & Barrese, LLP

(57) ABSTRACT

A channel decoding device for a receiver which receives symbols coded by inserting at least one specific bit in a data frame at a predetermined position. In the channel decoding device, a symbol inserter receives the symbols, inserts a symbol having a specific value at a predetermined specific bit insert position and outputs the received symbols at other positions. A decoder decodes symbols output from the symbol inserter.

17 Claims, 11 Drawing Sheets

CHANNEL ENCODING/DECODING IN COMMUNICATION SYSTEM

BACKGROUND OF THE INVENTION

1. Field of the Invention

The present invention relates generally to a communication system which processes data on a frame unit basis, and in particular, to a channel encoding device and a method thereof.

2. Description of the Related Art

In communication systems for processing voice, character, image and video signals, data is generally transmitted on a frame unit basis. A frame is defined as a basic timing internal in the system. Further, in a system for communicating such frame data, a channel encoder for error correction should also encode data on the frame unit basis. In this case, the channel encoder performs zero tail biting to indicate the termination of each frame so that a decoder can efficiently decode the frames using that information. Encoder tail bits represent a fixed sequence of bits added to the end of a data frame to reset the convolutional encoder to a known state. An IS-95 system typically uses a non-recursive systematic convolutional encoder, which adds a sequence of zero (0) bits to the end of each frame equal to the number of delays, to implement frame termination. However, in contrast to the non-recursive systematic convolutional encoder, a recursive systematic encoder cannot add the zero bits to the end of the frame to implement the frame termination because input bits are fed back to the delays.

FIG. 1 illustrates a block diagram of a conventional parallel turbo encoder, which is disclosed in U.S. Pat. No. 5,446,747 issued to Berrou. The encoder of FIG. 1 is one type of conventional recursive systematic encoder. The turbo encoder encodes an N-bit input frame into parity symbols using two simple constituent encoders, and can be configured to have either a parallel or serial structure. In addition, the turbo encoder of FIG. 1 uses recursive systematic convolutional codes as constituent codes.

The turbo encoder of FIG. 1 includes an interleaver 120 interposed between a first constituent encoder 110 and a second constituent encoder 130. The interleaver 120 has the same size as a frame length, N, of input data bits and re-arranges the order of the data bits input to the second constituent encoder 130 to reduce the correlation between the outputs of the first and second encoders.

The first constituent encoder 110 encodes the input data bits and the interleaver 120 interleaves (or randomizes) the bits in the input data stream according to a specified rule so that burst errors introduced by the channel can be converted to random errors. The second constituent encoder 130 encodes the output of the interleaver 120.

FIG. 2 is a diagram illustrating a termination scheme in the recursive systematic convolutional encoder of FIG. 1. For more detailed information, see D. Divsalar and F. Pollara, "On the Design of Turbo Dodes", TDA Progress Report 42–123, Nov. 15, 1995. Here, frame data input to the first and second constituent encoders 110 and 130 is assumed to be 20-bit data. In FIG. 2, D1-D4 denotes delays and XOR1-XOR6 exclusive OR gates.

Referring to FIG. 2, the operative steps to perform encoding are as follows. A switch SW1 is maintained in the ON position and a switch SW2 is maintained in the OFF position. Then, the 20-bit input frame data is applied in sequence to the delays D1-D4 and exclusively ORed by the exclusive OR gates XOR1-XOR6, thus outputting encoded bits at the output of exclusive OR gate XOR6. When the 20 data bits are all encoded in this manner, the switch SW1 is switched OFF and the switch SW2 is switched ON, for frame termination. Then, the XOR gates XOR1-XOR4 exclusively OR the output data bits of the delays and the corresponding fed-back data bits, respectively, thereby outputting zero bits. The resulting zero bits are again input to the delays D1-D4 and stored therein. These zero bits input to the delays D1-D4 become tail bits, which are applied to a multiplexer.

The multiplexer multiplexes the encoded data bits and the tail bits output from the constituent encoder. The number of generated tail bits depends on the number of the delays included in the constituent encoders 110 and 130. The termination scheme of FIG. 2 generates 4 tail bits per frame plus additional encoded bits generated for each of the respective tail bits, undesirably increasing the overall final encoded bit count, which leads to a decrease in a bit rate. That is, when the bit rate is defined as;

Bit Rate=(the Number of Input Data Bits)/(the Number of Output Data Bits), a constituent encoder having the structure of FIG. 2 has a bit rate of Bit Rate=(the Number of Input Data Bits)/{(the Number of Encoded Data Bits)+(the Number of Tail Bits)+(the Number of Encoded Bits for the Tail Bits)}.

Accordingly, in FIG. 2, since the frame data is composed of 20 bits and the number of delays equals 4, the bit rate becomes 20/28.

It is therefore apparent that the recursive, systematic convolutional encoder's performance depends upon the tailing method, because it is difficult to perfectly tail the turbo codes.

SUMMARY OF THE INVENTION

It is, therefore, an object of the present invention to provide a device and method for performing channel encoding/decoding using a frame structure, in which predetermined bits are inserted, in a recursive systematic encoder for a communication system.

It is another object of the present invention to provide a recursive systematic channel encoding device and method for inserting bits having a specific value in frame data at predefined positions before channel encoding.

It is further another object of the present invention to provide a channel decoding device and method for decoding channel coded data transmitted from a channel encoder, wherein the bits having specific values were inserted at predetermined positions of frame data during channel encoding.

It is yet another object of the present invention to provide a device and method for inserting a bit having a specific value at a specific symbol position out of channel coded symbols, and performing soft-decision decoding using the bit having the specific value to increase channel decoding performance.

In accordance with one aspect of the present invention, there is provided a channel decoding device for a receiver which receives symbols coded by inserting at least one specific bit in a frame data at a predetermined position. The channel decoding device comprises a symbol inserter receiving the symbols, for inserting a symbol having a specific value at predetermined specific bit insert position and outputting the received symbols at other positions; and a decoder for decoding symbols output from the symbol inserter.

More specifically, the channel decoding device comprises a demultiplexer receiving the symbols, for demultiplexing the received symbols into a data symbol, a first parity symbol and a second parity symbol; a symbol inserter for inserting a symbol having a specific value at predetermined specific bit insert position of the data symbol and outputting the received symbols at other positions; a first decoder for performing soft decision for the data symbol output from the symbol inserter and the first parity symbol to generate a first decoded symbol; a first interleaver for interleaving an output of the first decoder; a second decoder for performing soft decision for the first decoded symbol output from the first interleaver and the second parity symbol to generate a second decoded symbol; a hard-decision element for performing hard decision for the second decoded data; and a first deinterleaver for deinterleaving an output of the hard-decision element.

In accordance with another aspect of the present invention, there is provided a channel decoding method for a receiver which receives symbols coded by inserting at least one specific bit in a frame data at a predetermine position. The channel decoding method comprises the steps of: receiving the symbols, inserting a symbol having a specific value at a predetermined specific bit insert position and outputting the received symbols at other positions; and decoding the received symbols using the inserted symbol having the specific value.

More specifically, the channel decoding method comprises the steps of a) receiving the symbols, and demultiplexing the received symbols into a data symbol, a first parity symbol and a second parity symbol; b) inserting a symbol having a specific value at a predetermined specific bit insert position of the data symbol and outputting the received symbols at other positions; c) performing soft decision for the data symbol, in which the symbol having the specific value is inserted, and the first parity symbol to generate a first decoded symbol; d) interleaving the first decoded symbol; e) performing soft decision for the interleaved first decoded symbol and the second parity symbol to generate a second decoded symbol; f) deinterleaving the second decoded symbol; g) initializing a corresponding symbol of the deinterleaved second symbol to the specific value at an insert position, and returning to step c) to repeat the steps c) to e); h) upon completion of the steps c) to e), performing hard decision for the second decoded data; and i) deinterleaving the hard-decision processed second decoded symbol.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF THE PREFERRED EMBODIMENTS

Figure 1:
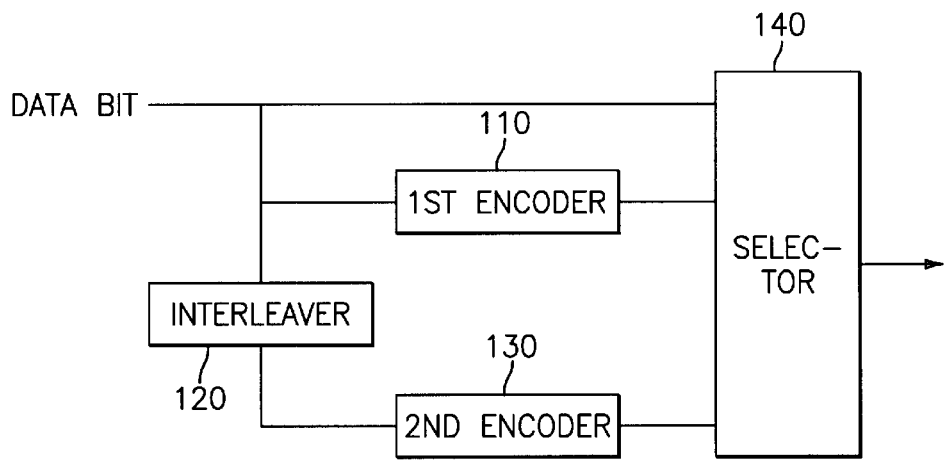
FIG. 1 is a block diagram illustrating a prior art channel encoder for use in a wireless communication system.
Figure 2:
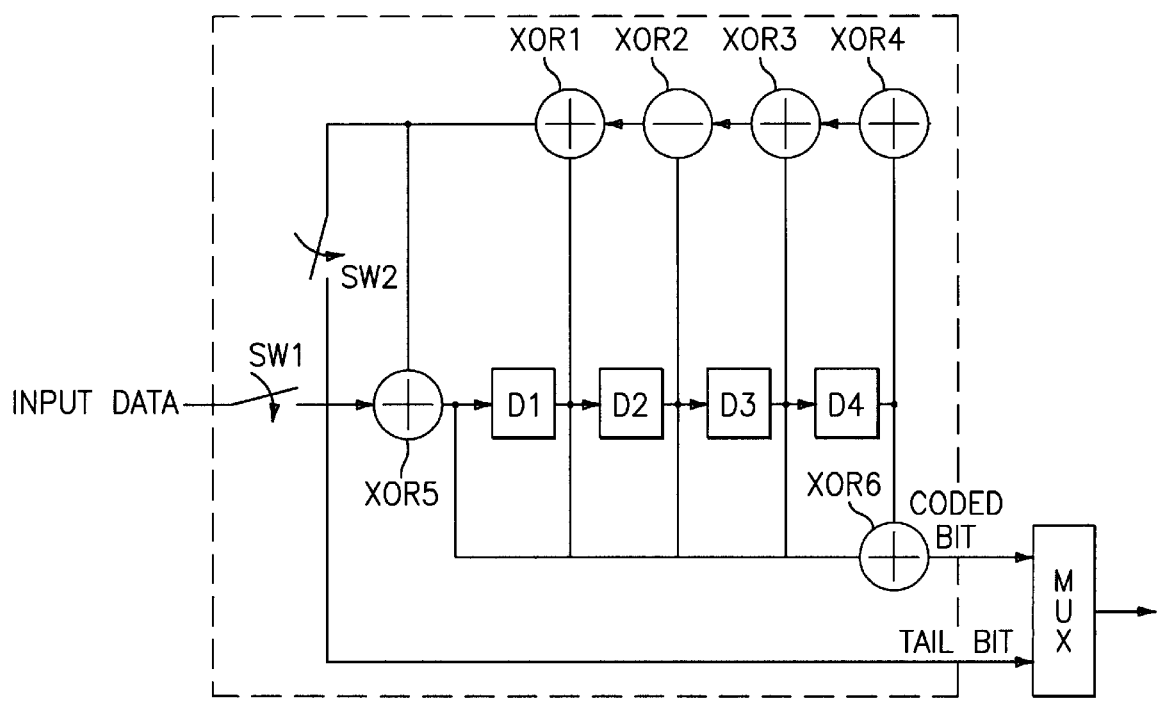
FIG. 2 is a detailed block diagram illustrating a prior art constituent encoder of FIG. 1.

Preferred embodiments of the present invention will be described herein below with reference to the accompanying drawings. In the following description, well known functions or constructions are not described in detail since they would obscure the invention in unnecessary detail. The term "data bit" as used herein refers to data which is not encoded, and the term "parity bit" refers to data which is encoded by a constituent encoder.

Generally, in a communication system, a transmitter encodes transmission data using a channel encoder and transmits the encoded data; a receiver then demodulates the data received from the transmitter to convert the received data into the original data. The channel encoder encodes the transmission data on a frame unit basis and generates tail bits, which are added to each frame to indicate a termination of the frame. The present invention proposes a frame structure having a termination effect in the channel encoder.

The frame structure having the termination effect can be implemented in accordance with several embodiments as described below:

First Embodiment: a number of specific bits are inserted in each channel frame at positions having a higher error occurrence probability, where the number of bits to be inserted is defined by the number of tail bits. Because the recursive systematic constituent encoders are not configured to generate tail bits, the error occurrence probability is determined by way of experiment, and the insert positions should be known to both the channel encoder and a channel decoder. The specific bits to be inserted should preferably be insignificant bits which have little or no impact on communication performance, whether they are transmitted or not. Also, they can be encoded bits or data bits predetermined with a receiver. Herein, they are assumed to be zero bits.

Second Embodiment: a number of bits are inserted in each channel frame at positions having a higher error occurrence probability, where the number of bits to be inserted is determined by the number of tail bits. The specific bits are inserted to exceed a predefined frame length. The bit-inserted data bits are encoded using the constituent encoders. Then, when outputting the channel encoded data, the bits exceeding the frame length of the channel encoded data are punctured at the bit-inserted positions of the input data. Here, the recursive systematic encoder does not generate tail bits and the channel decoder should have prior knowledge of the bit-inserted positions.

Third Embodiment: a number of specific bits are inserted in each channel frame at positions having a higher error occurrence probability, where the number of bits to be inserted is determined by the number of tail bits. The constituent encoder generates tail bits for termination and associated encoded data for the tail bits and thereafter, punctures the data bits at specific insert positions in each channel frame to insert the tail bits and the encoded data for the tail bits in the punctured positions selected for bit insertion.

First Embodiment

An encoder according to a first embodiment of the present invention does not generate tail bits, but rather, inserts specific bits at predetermined positions to perform the termination function. In this embodiment, one 24-bit frame includes 16 data bits, and 8 specific bits, where each of the 8 specific bits are zero bits inserted in the frame at bit positions having a higher error probability. Here, the bit insert positions are determined by experimentally detecting the positions where most errors occur while decoding the encoded data. Further, each constituent encoder uses a ⅓ coding rate.

In this embodiment, the positions having the higher error probability during decoding are experimentally determined, when the 24-bit frame data (i.e., 16 frame data bits plus the 8 specific bits) is encoded using a turbo encoder having a ⅓ coding rate. Eight bit positions having the relatively higher error probability are determined, and at the specific bits are inserted at the determined positions. Here, the decoder knows the bit-inserted positions, when decoding the encoded frame data in which the specific codes are inserted.

When the inserted specific bits are zero bits (in practice, the "0" bits are transmitted as "−1"), the zero bits at the insert positions are changed to a large negative value (e.g., −5) highly inclined to "−1" before decoding, in order to increase reliability. This is to improve decoding performance, and the inserted specific bit can vary in value during transmission in a radio environment. However, since the decoder previously knows the position of the specific bit to be received, the decoder inserts a higher value other than "−1" for the specific bit in the actual decoding process. In this case, the decoder can improve decoding performance by virtue of the inserted specific value. This decoding operation will be described in detail with reference to FIG. 14. In this manner, the decoder decoding the bits, knows at least 8 bits of the 24 by virtue of them being transmitted as a large negative value, thereby increasing decoding performance. In this embodiment, the shorter the frame becomes, the higher the performance increases.

Figure 3:
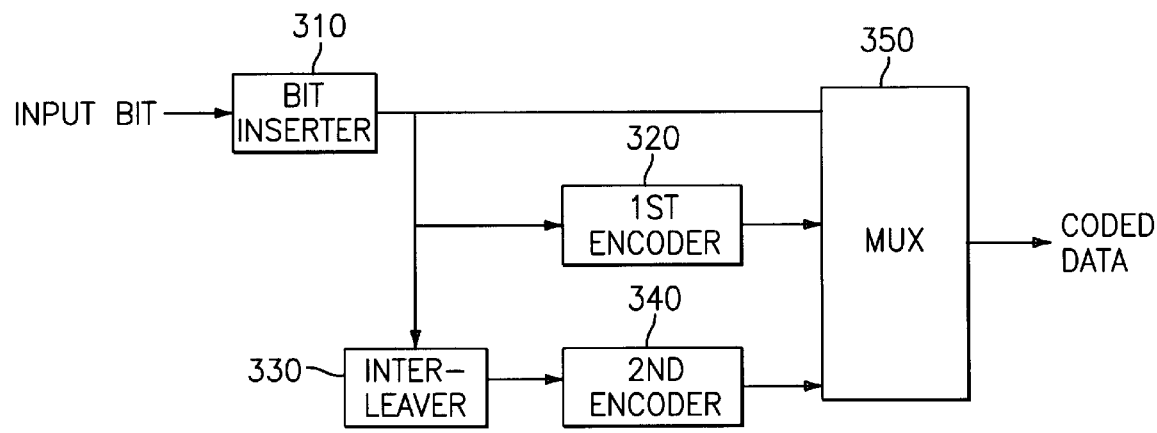
FIG. 3 is a diagram illustrating a channel encoder according to a first embodiment of the present invention.

FIG. 3 is a diagram illustrating a turbo encoder having a bit inserter for inserting the specific bits according to the first embodiment of the present invention. A bit inserter 310 includes a bit generator for generating specific bits by processing input data bits, and generates data bits in the frame unit by inserting the specific bits generated by the bit generator at predefined bit insert positions. A first constituent encoder 320 encodes the data bits output from the bit inserter 310. An interleaver 330 interleaves the data bits in the frame unit, output from the bit inserter 310, according to a predetermined rule so as to re-arrange the sequence of the data bits. In the exemplary embodiment, a diagonal interleaver is used for the interleaver 330.

A second constituent encoder 340 encodes the interleaved data bits in the frame unit, output from the interleaver 330. Recursive systematic convolutional encoders can be used for the first and second constituent encoders 320 and 340. A multiplexer 350 multiplexes outputs of the bit inserter 310, the first constituent encoder 320 and the second constituent encoder 340, under the control of a undepicted controller. Here, the bit inserter 310 outputs the data bits $I_k$. The first constituent encoder 320 outputs the first parity bits $P1_k$, and the second constituent encoder 340 outputs the second parity bits $P2_k$.

Figure 4:
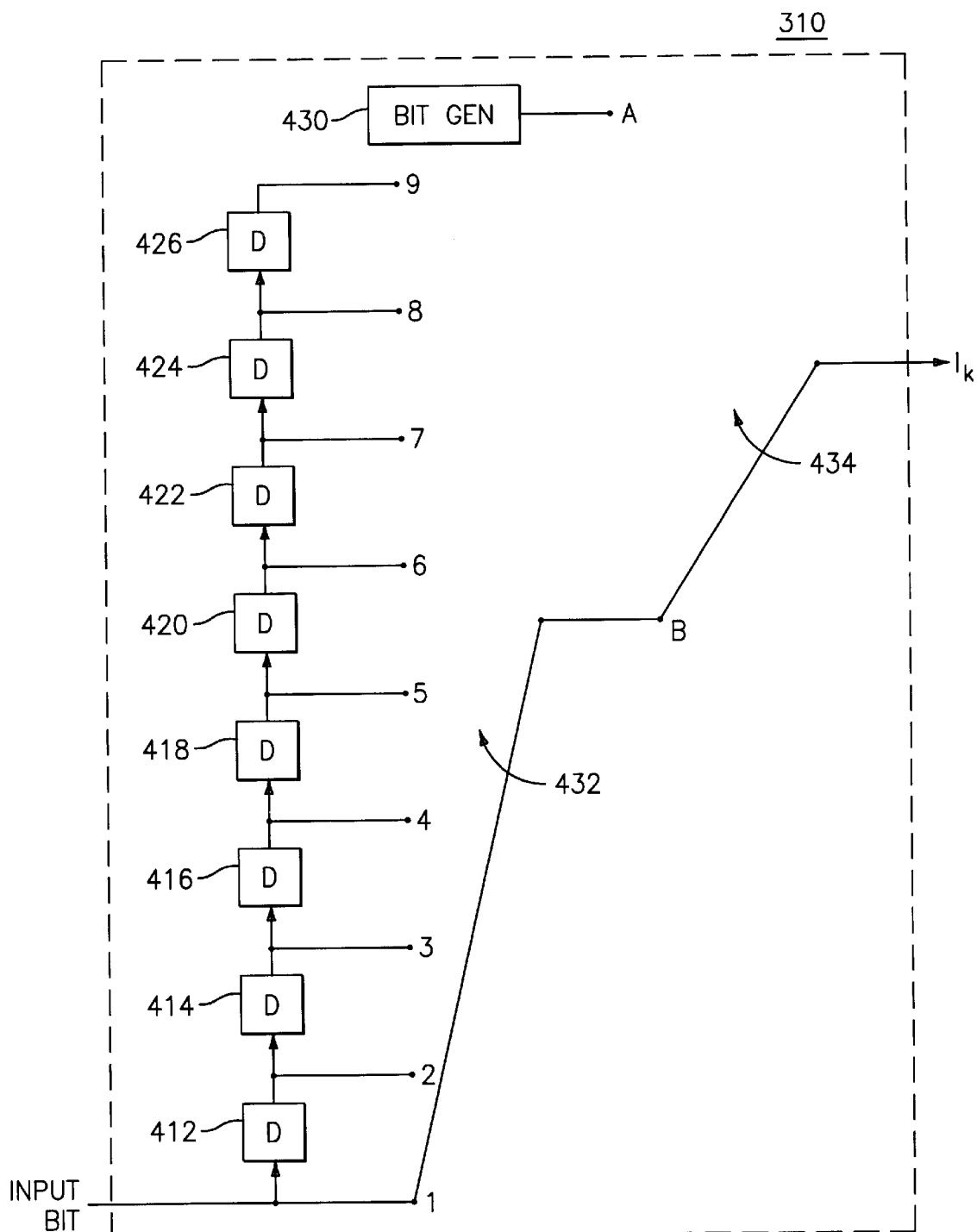
FIG. 4 is a detailed diagram illustrating a bit inserter of FIG. 3.

FIG. 4 is a detailed block diagram illustrating the bit inserter 310 in the turbo encoder of FIG. 3. Referring to FIG. 4, a bit generator 430 generates specific bits to be inserted in the data bits. Here, the specific bits are assumed to be zero bits. Delays 412–426, which can be composed of memory elements such as flip-flops, may have a serial shift register structure for shifting input data bit according to a bit clock.

A switch 432 is switched to select the outputs of the delays 412–426, under the control of the undepicted controller (not shown). Also, the switch 432 is switched to an output of a next delay at the positions where a specific bit output from the bit generator 430 is inserted in the data bits, under the control of the undepicted controller. That is, the switch 432 selects a data bit being delayed by one bit, when the selected specific bit is inserted in the data bits. The switch 432 can be implemented by a multiplexer. A switch 434 is switched to outputs of the bit generator 430 and the switch 432 to generate data bits $I_k$, under the control of the undepicted controller. The switch 434 selects the specific bits in the data bits for insertion at the predefined positions under the control of the controller.

Referring to FIG. 4, a description will be made directed to the operation of inserting the specific bits. The input data bits are delayed by the delays 412–426 according to the bit clock. Initially, the switch 432 selects the input data bits (i.e., Pole 1) and the switch 434 is initially connected to the switch 432 (i.e., Pole B). Then, the input data bits are output via the switches 432 and 434. In the meantime, when a bit insert position is determined, the switch 432 is connected to the output of the delay 412 (i.e., Pole 2) and the switch 434 is connected to the output of the bit generator 430 (i.e., Pole A), under the control of the controller. As a result, a path for the data bits is cut off and the zero bit output from the bit generator 430 is inserted in the corresponding bit position. In the case where the data bits are continuously output after insertion of the zero bit, the switch 434 is again connected to the switch 432 by the controller. That is, since the one bit-delayed data bit is selected after insertion of the zero bit, the zero bit can be inserted at the predefined position without loss of the data bit.

The zero bits are inserted in the data bits for one frame by repeating this process. Upon reception of data bits for the next frame after insertion of the zero bits, the switch 432 is again connected to a input bit node (Pole 1) and then, the above process is repeated again. In the case where the data bits are encoded for communication, an error probability is statistically relatively higher at the rear portion of the data bit stream input to the respective constituent encoders. Accordingly, the positions where the zero bits output from the bit generator 430 are inserted, can be mostly located at the rear portion of the data bit stream as shown in Table 1, by way of example.

TABLE 1

| I1 I2 I3 I4 I5 I6 I7 I8 I9 I10 I11 Ib1 I12 I13 I14 Ib2 I15 I16 Ib3 Ib4 Ib5 Ib6 Ib7 Ib8 |
| --- | where Ix denotes data bits and Ibx inserted bits.

The reason for inserting the specific bits in the data bit stream is to improve decoding performance at the receiver. Therefore, it is preferable to insert the specific bits at those bit positions in the channel frame having a higher error occurrence probability, where the number of inserted bits is determined by the number of tail bits. In most cases, the bit positions having the higher error occurrence probability are distributed at the rear portion of the data bit stream input to the constituent encoders, as shown in Table 1. Accordingly, the specific bits are inserted primarily at the rear portion of the data bit streams. The modified data stream is input to the first and second constituent encoders 320 and 340, respectively. Here, for the second constituent encoder 340, the specific bits should be inserted at the rear portion of the interleaved data bits output from the interleaver 330. Accordingly, the bit inserter 310 should take this into consideration in inserting the specific bits in the data bits applied to the second constituent encoder 340.

Figure 5:
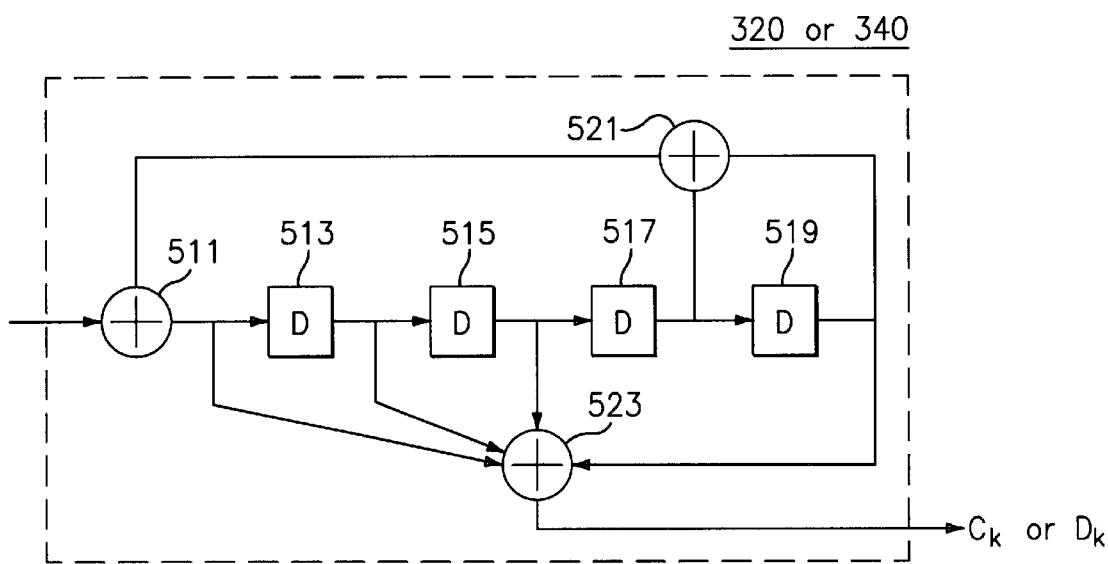
FIG. 5 is a detailed diagram illustrating a constituent encoder of FIG. 3.

The data bits of Table 1, output from the bit inserter 310, are applied to both the first constituent encoder 320 and the interleaver 330 in parallel. The interleaved data bits in the frame unit, output from the interleaver 330, are encoded by the second constituent encoder 340. FIG. 5 illustrates a structure of the first and second constituent encoders 320 and 340 of FIG. 3 in accordance with the first embodiment. As illustrated, the first and second constituent encoders 320 and 340 are recursive systematic convolutional encoders. In addition, the constituent encoders 320 and 340 are configured not to generate tail bits, as shown in FIG. 5.

The first constituent encoder 320 encodes the data bits of Table 1, output from the bit inserter 310. The encoded data bits output from the first constituent encoder 320 are shown in Table 2.

TABLE 2

| C1 C2 C3 C4 C5 C6 C7 C8 C9 C10 C11 Cb1 C12 C13 C14 Cb2 C15 C16 Cb3 Cb4 Cb5 Cb6 Cb7 Cb8 |
| --- | where Cx denotes symbols output from the first constituent encoder 320, and Cbx denotes symbols of the inserted bits, output from the first constituent encoder 320. Here, in the case where the first constituent encoder 320 has the ⅓ coding rate, each symbol C becomes three symbols.

In the meantime, the interleaver 330 interleaves the data bits output from the bit inserter 310 and the second constituent encoder 340 encodes the interleaved data bits output from the interleaver 330. The encoded data bits output from the second constituent encoder 340 are shown in Table 3.

TABLE 3

| D1 D2 D3 D4 D5 D6 D7 D8 D9 D10 D11 Db1 D12 D13 D14 Db2 D15 D16 Db3 Db4 Db5 Db6 Db7 Db8 |
| --- | where Dx denotes symbols output from the second constituent encoder 340 and Dbx symbols of the inserted bits, output from the second constituent encoder 340. Here, in the case where the second constituent encoder 340 has the ⅓ coding rate, each symbol D becomes three symbols. Although the sequence of the data bits was actually rearranged by interleaving, the sequence remains unchanged in Table 3, for the convenience of explanation.

The multiplexer 350 then multiplexes the outputs of the bit inserter 310, the first constituent encoder 320 and the second constituent encoder 340, under the control of the undepicted controller. Shown in Table 4 are the specific bit inserted-data bits and outputs of the first and second constituent encoders 320 and 340. The multiplexer 350 can multiplex input symbols in the sequence of the data symbol, the first parity symbol and the second parity symbol either on a frame unit basis as shown in Table 4, or on a symbol unit basis.

having a higher error occurrence probability. The second embodiment may be differentiated from the first embodiment in that the number of the inserted bits is set to exceed the frame size (or length). In this exemplary embodiment, each frame is assumed to include 16 input data bits $I_k$ and 12 inserted bits. Since the output data bits $I_k$, parity bits $C_k$ and $D_k$ should equal 24 bits and 28 bits are generated in total, the surplus parity bits $C_k$ and $D_k$ are punctured from the data bits $I_k$ at the bit-inserted positions.

Figure 7:
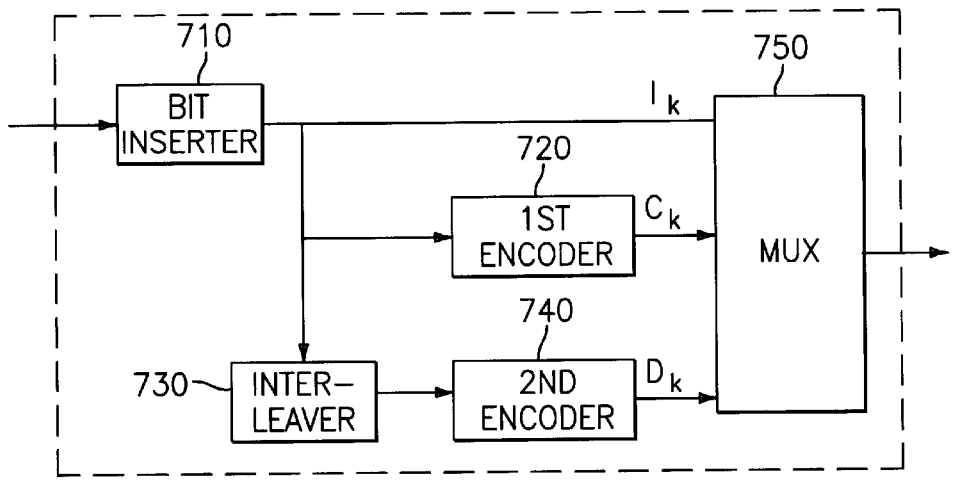
FIG. 7 is a diagram illustrating a channel encoder according to a second embodiment of the present invention.

FIG. 7 is a diagram illustrating the channel encoder according to the second embodiment of the present invention. A bit inserter 710 includes a bit generator for generating

TABLE 4

| I1 I2 I3 I4 I5 I6 I7 I8 I9 I10 I11 Ib1 I12 I13 I14 Ib2 I15 I16 Ib3 Ib4 Ib5 Ib6 Ib7 Ib8 |
|---|
| C1 C2 C3 C4 C5 C6 C7 C8 C9 C10 C11 Cb1 C12 C13 C14 Cb2 C15 C16 Cb3 Cb4 Cb5 Cb6 Cb7 Cb8 |
| D1 D2 D3 D4 D5 D6 D7 D8 D9 D10 D11 Db1 D12 D13 D14 Db2 D15 D16 Db3 Db4 Db5 Db6 Db7 Db8 |

Figure 6:
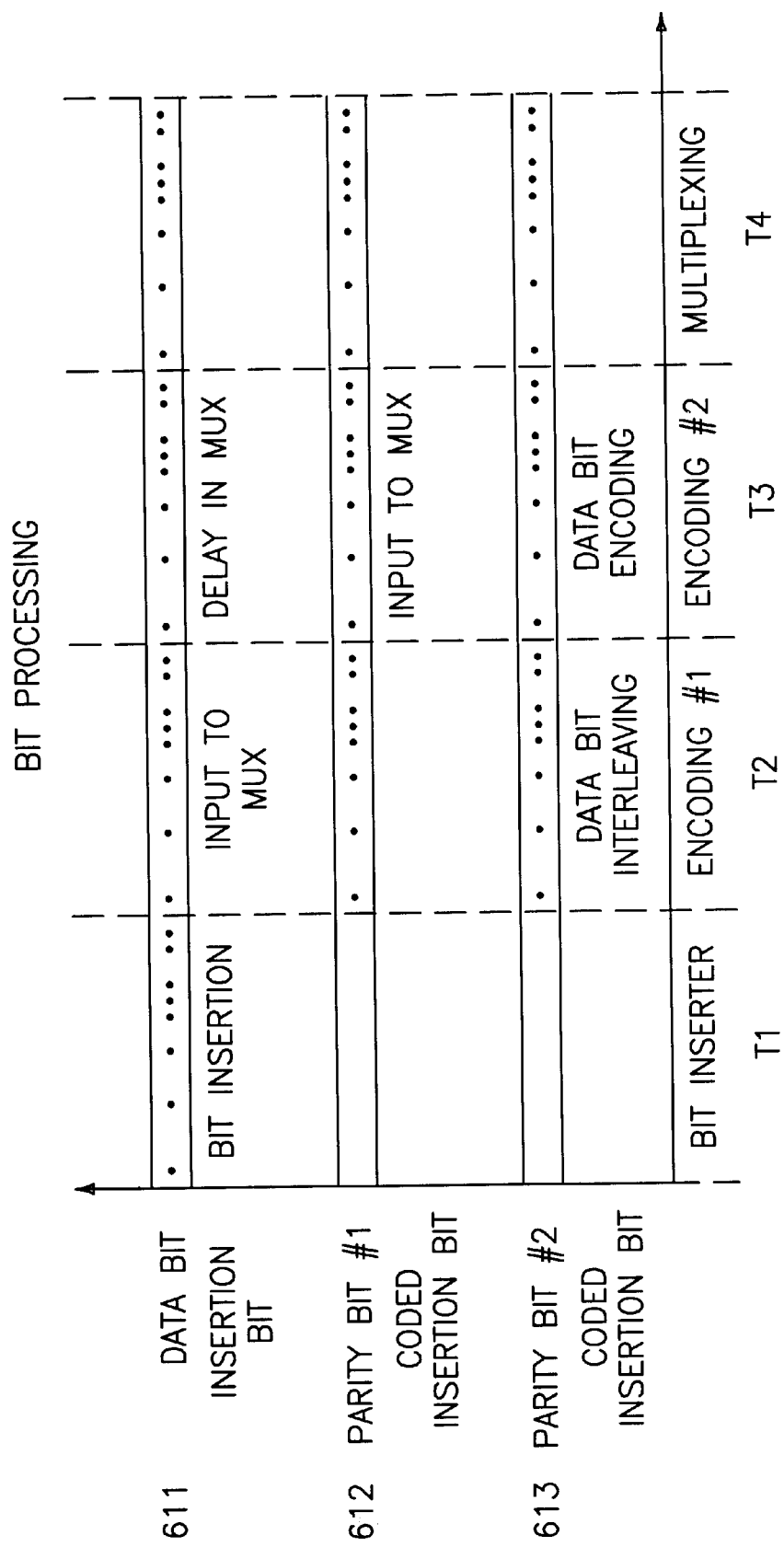
FIG. 6 is a diagram illustrating a bit processing procedure according to the first embodiment of the present invention.

FIG. 6 is a timing diagram of the turbo encoder of FIG. 3 according to the first embodiment of the present invention. Referring to FIG. 6, in an interval T1, the bit inserter 310 inserts the zero bits in the frame at the predefined bit positions to generate the data bits $I_k$ of Table 1 (see 611). In an interval T2, the zero bit-inserted data bits $I_k$ are simultaneously applied to the multiplexer 350, the first constituent encoder 320 and the interleaver 330. Then, in the T2 interval, the first constituent encoder 320 encodes the zero bit-inserted data bits $I_k$ to generate first encoded data bits $C_k$ which are the first parity bits (see 612), and in the same T2 interval, the interleaver 330 interleaves the zero bit-inserted data bits $I_k$ according to the predefined rule (see 613).

Thereafter, in an interval T3, the multiplexer 350 delays the data bits $I_k$ output from the bit inserter 310 by one frame period, the first constituent encoder 320 inputs the first encoded data bits $C_k$ to the multiplexer 350 and the second constituent encoder 340 encodes the interleaved data bits $I_k$ output from the interleaver 330 to generate second encoded data bits $D_k$ which are the second parity bits. Upon completion of generating the second parity bits $D_k$ by the second constituent encoder 340, the multiplexer 350 multiplexes the data bits $I_k$, the first parity bits $C_k$ and the second parity bits $D_k$, in an interval T4.

Although FIG. 6 shows an example of parallel processing the data bits $I_k$, the first parity bits $C_k$ and the second parity bits $D_k$, it is also possible to serially output the outputs of the bit inserter 310, the first constituent encoder 320 and the second constituent encoder 340 in the order of bit generation.

As can be appreciated from the foregoing descriptions, in the recursive systemic turbo encoder according to the first embodiment, the respective constituent encoders do not generate tail bits for termination, but instead, insert some number of specific bits (i.e., zero bits) at bit positions having a determined higher error probability.

Second Embodiment

A channel encoder according to a second embodiment of the present invention inserts specific bits at bit positions specific bits by processing input data bits, and generates data bits exceeding the frame size by inserting the specific bits generated by the bit generator at predefined bit positions. A first constituent encoder 720 encodes the data bits output from the bit inserter 710 to generate first parity bits $C_k$. An interleaver 730 interleaves the data bits in the frame unite, output from the bit inserter 710, according to a predetermined rule so as to change arrangement (or sequence) of the data bits. In the exemplary embodiment, a diagonal interleaver is used for the interleaver 730.

A second constituent encoder 740 encodes the interleaved data bits in the frame unit, output from the interleaver 730, to generate second parity bits $D_k$. A recursive systemic convolutional encoder can be used for the first and second constituent encoders 720 and 740. A multiplexer 750 multiplexes outputs of the bit inserter 710, the first constituent encoder 720 and the second constituent encoder 740 to generate a data frame of a predefined length, under the control of a undepicted controller. Here, the bit inserter 710 outputs the data bits $I_k$, the first constituent encoder 720 outputs the first parity bits $P1_k$ and the second constituent encoder 740 outputs the second parity bits $P2_k$.

In operation, upon receipt of the 16 input data bits $I_k$, the bit inserter 710 operates in the same manner as the bit inserter 310 of the first embodiment. The bit inserter 710 has a structure similar to that of FIG. 4 except that it is composed of 12 delays. Therefore, the bit inserter 710 inserts 12 zero bits in the frame at 12 bit positions having the higher error probability by controlling the internal switches under the control of the controller. Accordingly, in this embodiment, the bit inserter 710 outputs the 28 data bits $I_k$ (i.e., 16 data bits and 12 zero bits), which are simultaneously applied to the multiplexer 750, the first constituent encoder 720 and the interleaver 730. Further, the interleaved data bits $I_k$ output from the interleaver 730 are applied to the second constituent encoder 740. Here, the first and second constituent encoders 720 and 740 have the structure of FIG. 5, which does not generate the tail bits for termination.

The first constituent encoder 720 then encodes the 28 data bits $I_k$ output from the bit inserter 710 with the 12 zero bits inserted therein, and outputs 28 first parity bits $C_k$ to the multiplexer 750. The interleaver 730 interleaves the 28 data bits $I_k$ output from the bit inserter 710, and the second constituent encoder 740 encodes the interleaved data bits in the same manner as the first constituent encoder 720 to generate 28 second parity bits $D_k$, which are applied to the multiplexer 750. The multiplexer 750 punctures the data bits $I_k$ to insert the four first parity bits $C_k$ and the four second parity bits $D_k$ in the punctured positions and then, outputs the remaining 24 first parity bits $C_k$ and the remaining 24 second parity bits $D_k$.

Figure 8:
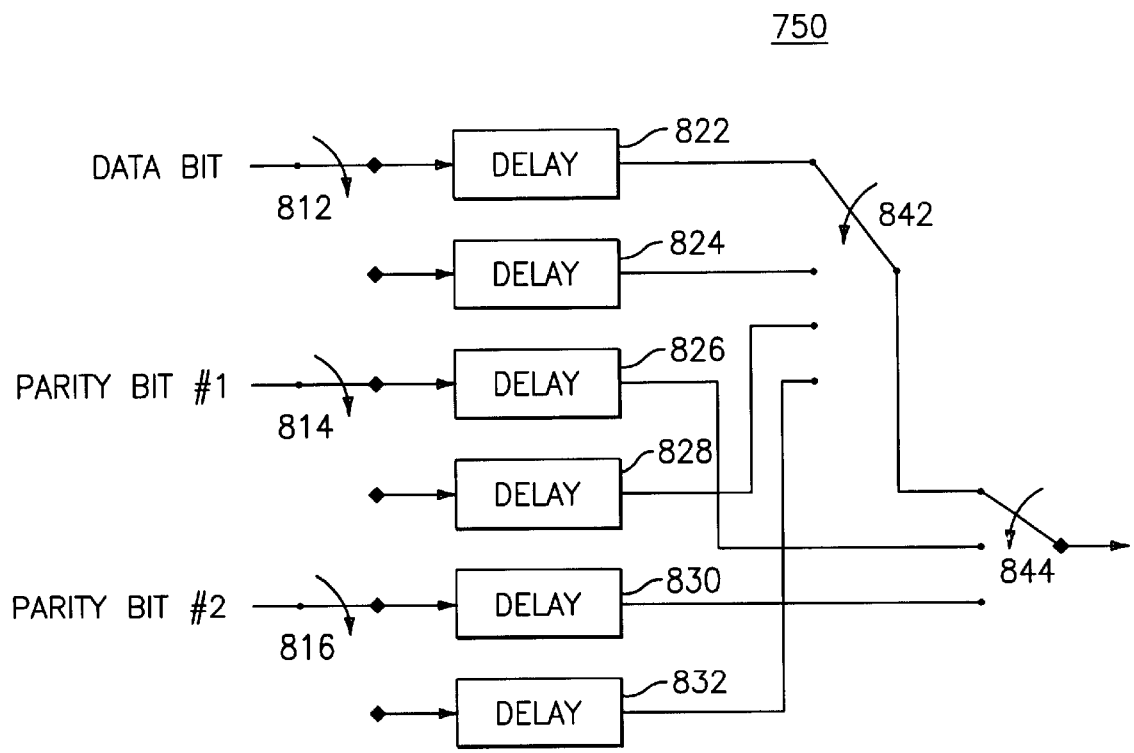
FIG. 8 is a detailed diagram illustrating a multiplexer of FIG. 7.

Referring to FIG. 8, the multiplexer 750 first receives the 28 data bits $I_k$ output from the bit inserter 710. Then, a switch 812 in the multiplexer 750 is connected to a delay 822 until the first 24 data bits out of the 28 data bits $I_k$ are received from the bit inserter 710. The delay 822 delays the first 24 received data bits $I_k$. Thereafter, the switch 812 is connected to a delay 824 until the remaining 4 data bits out of the 28 data bits $I_k$ are received from the bit inserter 710. The delay 824 delays the remaining 4 data bits.

In the same manner, the multiplexer 750 receives the 28 first parity bits $C_k$ output from the first constituent encoder 720. Then, a switch 814 in the multiplexer 750 is connected to a delay 826 until the first 24 data bits out of the 28 first parity bits $C_k$ are received from the first constituent encoder 720, and the delay 826 delays the received first parity bits $C_k$. Thereafter, the switch 814 is connected to a delay 828 until the remaining 4 first parity bits out of the 28 first parity bits $C_k$ are received from the first constituent encoder 720, and the delay 828 delays the received remaining 4 first parity bits.

Thereafter, the multiplexer 750 receives the 28 second parity bits $D_k$ output from the second constituent encoder 740. Then, a switch 816 in the multiplexer 750 is connected to a delay 830 until the first 24 data bits out of the 28 second parity bits $D_k$ are received from the second constituent encoder 740, and the delay 830 delays the received second parity bits $D_k$. Thereafter, the switch 816 is connected to a delay 832 until the remaining 4 second parity bits out of the 28 second parity bits $D_k$ are received from the second constituent encoder 740, and the delay 832 delays the received remaining 4 second parity bits.

As described above, the multiplexer 750 sequentially receives the 28 data bits $I_k$, the 28 first parity bits $C_k$ and the 28 second parity bits $D_k$, and separately stores the first 24 bits and the remaining 4 bits out of the respective bits in the corresponding delays. The switches 812–816 are controlled by the undepicted controller. Further, the delays 822–832 each are composed of cascaded memory elements and store the input bits until the corresponding delay process is completed.

Upon completion of the delay process, the switch 844 is connected to a switch 842 and the switch 842 is connected to the delay 822. Therefore, an output of the delay 822 is output via the switches 842 and 844. When one data bit stored in the delay 822 is output, the switch 842 is connected to the delay 824, maintaining connection with the switch 844. Then, one of the remaining data bits stored in the delay 824 is output via the switches 842 and 844. That is, the data bit stored in the delay 822. is punctured and then, the data bit stored in the delay 824 is output. Thereafter, the switch 842 is connected to the delay 822, continuously maintaining connection with the switch 844. By repeating the above process 4 times, the data bits stored in the delay 822 are punctured and then, the remaining four data bits stored in the delay 824 are inserted in the punctured positions.

Subsequently, the switch 842 is connected to the delay 822, maintaining connection with the switch 844. Then, the output of the delay 822 is output via the switches 842 and 844. When one data bit stored in the delay 822 is output, the switch 842 is connected to the delay 828, maintaining connection with the switch 844. Then, one of the remaining four first parity bits stored in the delay 828 is output via the switches 842 and 844. Thereafter, the switch 842 is connected again to the delay 822, continuously maintaining connection with the switch 844. By repeating the above process 4 times, the data bits stored in the delay 822 are punctured and then, the remaining four first parity bits stored in the delay 828 are inserted in the punctured positions.

In this manner, the data bits and the remaining four first parity bits are alternately output. Next, the switch 842 is connected to the delay 822, maintaining connection with the switch 844. Then, the output of the delay 822 is output via the switches 842 and 844. When one data bit stored in the delay 822 is output, the switch 842 is connected to the delay 832, maintaining connection with the switch 844. Then, one of the remaining four second parity bits stored in the delay 832 is output via the switches 842 and 844. Thereafter, the switch 842 is connected again to the delay 822, continuously maintaining connection with the switch 844. By repeating the above process 4 times, the data bits stored in the delay 822 are punctured and then, the remaining four second parity bits stored in the delay 832 are inserted in the punctured positions.

By way of the foregoing procedure, the 24 data bits stored in the delay 822 are punctured and then, the remaining 4 data bits stored in the delay 824, the remaining 4 first parity bits stored in the delay 828 and the remaining 4 second parity bits stored in the delay 832 are inserted in the punctured positions. Accordingly, the multiplexer 750 punctures the data bits $I_k$ output from the bit inserter 710 and inserts the 8 parity bits in the punctured insert positions, thereby outputting 24 data bits.

Upon completion of the above process, the switch 844 is connected to the delay 826. Then, the 24 first parity bits $C_k$ stored in the delay 826 are output. Thereafter, the switch 844 is connected to the delay 830 to output the 24 second parity bits $D_k$ stored in the delay 830.

Figure 9:
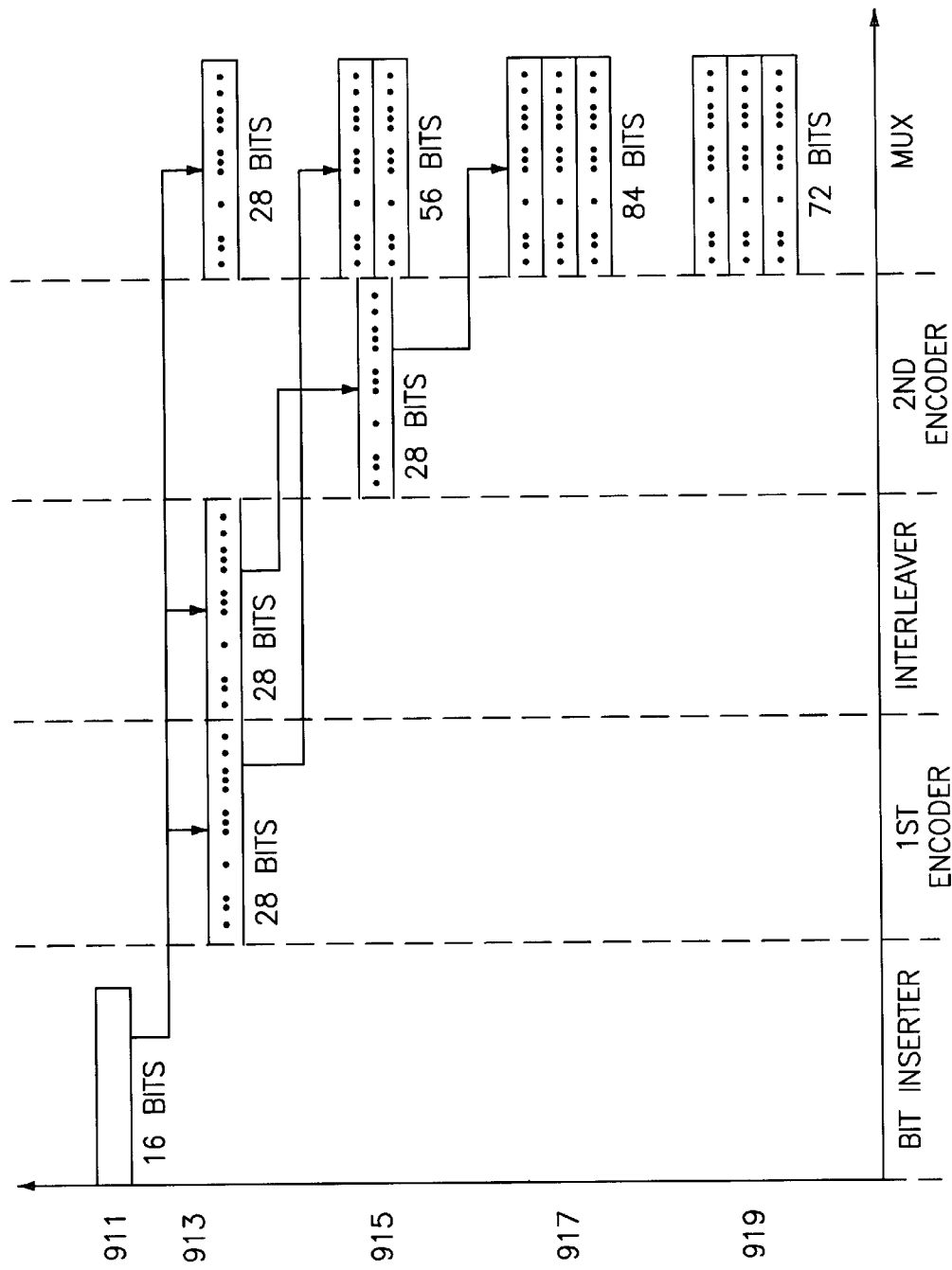
FIG. 9 is a diagram illustrating a bit processing procedure according to a second embodiment of the present invention.

Referring to FIG. 9, in the encoder of FIG. 7 according to the second embodiment, the bit inserter 710 inserts 12 bits in the 16 input data bits to generate the 28 data bits $I_k$. The first and second constituent encoders 720 and 740 generate the 28 first parity bits $C_k$ and the 28 second parity bits $D_k$, respectively. The multiplexer 750 punctures the 28 data bits $I_k$ at 12 insert positions and then, inserts therein the remaining 4 data bits, the remaining 4 first parity bits and the remaining 4 second parity bits. Thereafter, the multiplexer 750 sequentially outputs the data bits $I_k$, the first parity bits $C_k$ and the second parity bits $D_k$.

In the decoding process, the output values of the multiplexer 750 are demultiplexed into a data bit portion, a first parity bit portion and a second parity bit portion, wherein the data bit portion is punctured with a value of "−5" at the bit inserting portion. Such processed data bits are decoded by an existing decoder. (See Claude Berrou, Alain Glavieux and Punya Thitmajshima "Near Shannon Limit Error-Correction Coding and Decoding: Turbo-Codes (1)".)

Third Embodiment

An encoder according to a third embodiment of the present invention inserts bits having a specific logic in the data bits at the bit positions having the higher error occurrence probability, wherein the constituent encoders encode the specific bit-inserted data bits and generate tail bits to be added to encoded data bits. That is, the encoder according to the third embodiment performs the termination function by bit inserting and tail bit adding.

Figure 10:
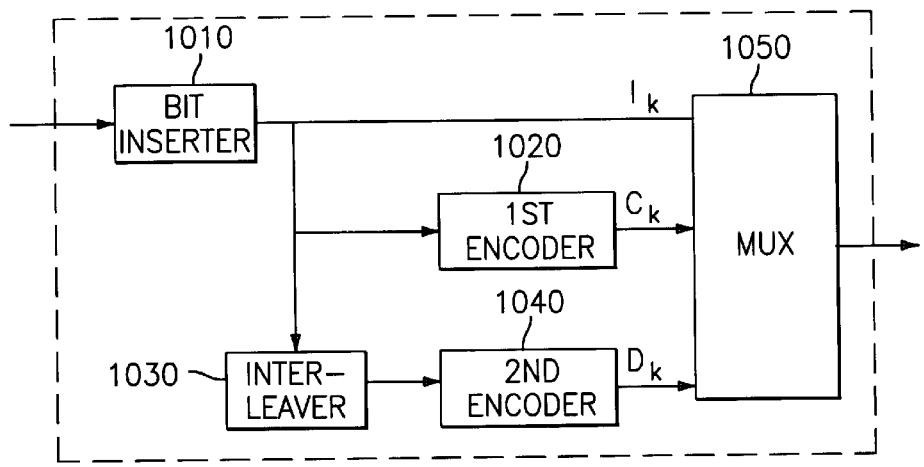
FIG. 10 is a diagram illustrating a channel encoder according to a third embodiment of the present invention.

FIG. 10 is a diagram illustrating the encoder according to the third embodiment of the present invention. Referring to FIG. 10, a bit inserter 1010 receives 16 input bits and has the same structure as the bit inserter 310 according to the first embodiment. The bit inserter 1010 inserts 8 zero bits in a frame at 8 data bit positions having the higher error probability, under the control of a undepicted controller. Accordingly, in this exemplary embodiment, the bit inserter 1010 outputs 24 data bits $I_k$, which are applied in common to a multiplexer 1050, a first constituent encoder 1020 and an interleaver 1030.

Further, the interleaved data bits $I_k$ output from the interleaver 1030 are applied to a second constituent encoder 1040. The first constituent encoder 1020 is a recursive systemic constituent encoder shown in FIG. 11, having a structure for generating the tail bits to be added to the encoded data bits. In addition, the first constituent encoder 1020 has a structure which does not generate the tail bits for termination, as that in FIG. 5 of the first embodiment.

Figure 11:
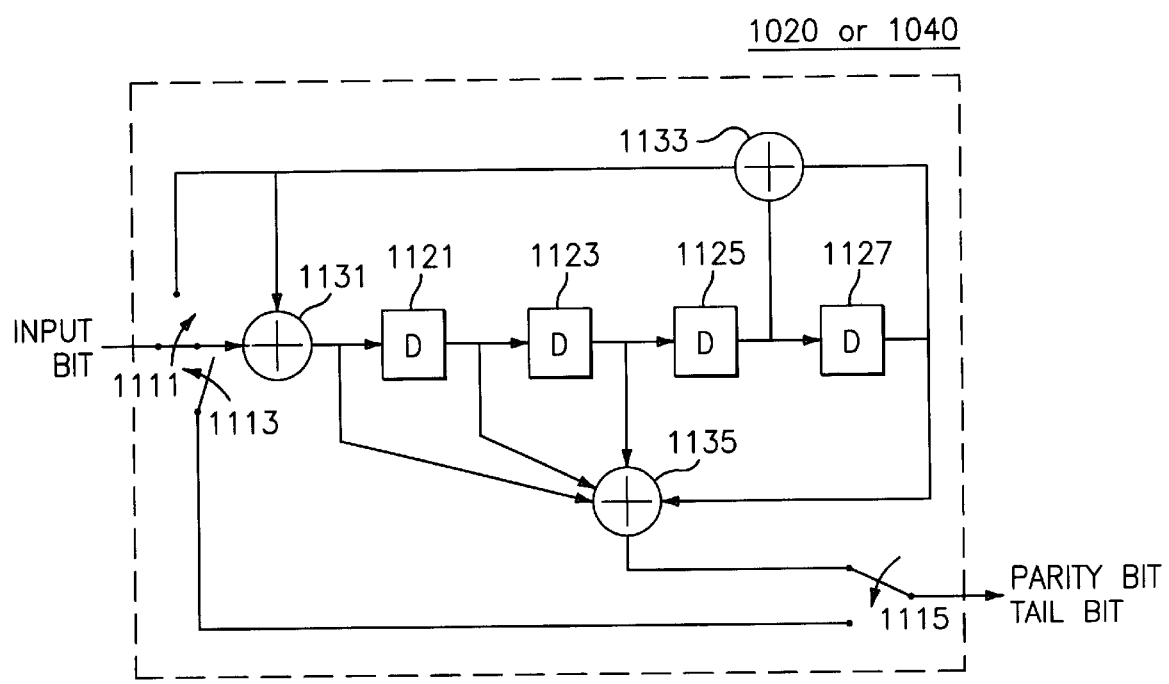
FIG. 11 is a detailed diagram illustrating a constituent encoder of FIG. 10.

Referring to FIG. 11, operation of the first constituent encoder 1020 will be described. For encoding, a switch 1111 connects an input node to an exclusive OR gate 1131, a switch 1113 maintains an OFF state, and a switch 1115 is connected to an exclusive OR gate 1135. Then, the 24 data bits $I_k$ are sequentially applied to delays 1121–1127 via the switch 1111 and the exclusive OR gate 1131, and the exclusive OR gate 1135 outputs encoded data bits. When the data bits $I_k$ are all encoded by the delays 1121–1127 and the exclusive OR gate 1135 in this manner, the switch 1111 is connected to exclusive OR gates 1133 and 1131, the switch 1113 is ON, and the switch 1115 is connected to the switch 1113. Then, zero bits are generated by exclusive ORing the outputs being fed back, stored in the delays 1121–1127 and output via the switch 1115. Here, the zero values stored in the delays 1121–1127 become the tail bits and are output through the switch 1115. The number of tail bits generated corresponds to the number of delays in the constituent encoder 1020. In FIG. 11, the constituent encoder 1020 generates 4 tail bits per frame and also generates encoded bits for the respective tail bits.

Accordingly, the first constituent encoder 1020 generates 24 first parity bits $C_k$ and, upon processing the last data bit (i.e., the $24^{th}$ data bit), connects the switch 1111 to the exclusive OR gate 1133, the switch 1113 to the switch 1111 and the switch 1115 to the switch 1113; the same process is repeated four times to generate 4 tail bits. Through this procedure, the 28 first parity bits $C_k$ and the 4 tail bits are output to the multiplexer 1050.

In addition, the interleaver 1030 interleaves the 24 data bits $I_k$ output from the bit inserter 1010 and provides the interleaved data bits to the second constituent encoder 1040. The second constituent encoder 1040 then encodes the interleaved data bits in the same manner as the first constituent encoder 1020 to generate 24 second parity bits $D_k$, which are applied to the multiplexer 1050.

The interleaved data bits in the frame unit, output from the interleaver 1030, are encoded by the second constituent encoder 1040 which has the same structure as that shown in FIG. 5. The second constituent encoder 1040 is a recursive systemic convolutional encoder, as shown in FIG. 5. In addition, the second constituent encoder 1040 has a structure which does not generate the tail bits.

The multiplexer 1050 then punctures the data bits $I_k$, and inserts the 4 first parity bits $C_k$ in the punctured positions, and selectively outputs the remaining 24 first parity bits $C_k$ and the 24 second parity bits $D_k$.

Figure 12:
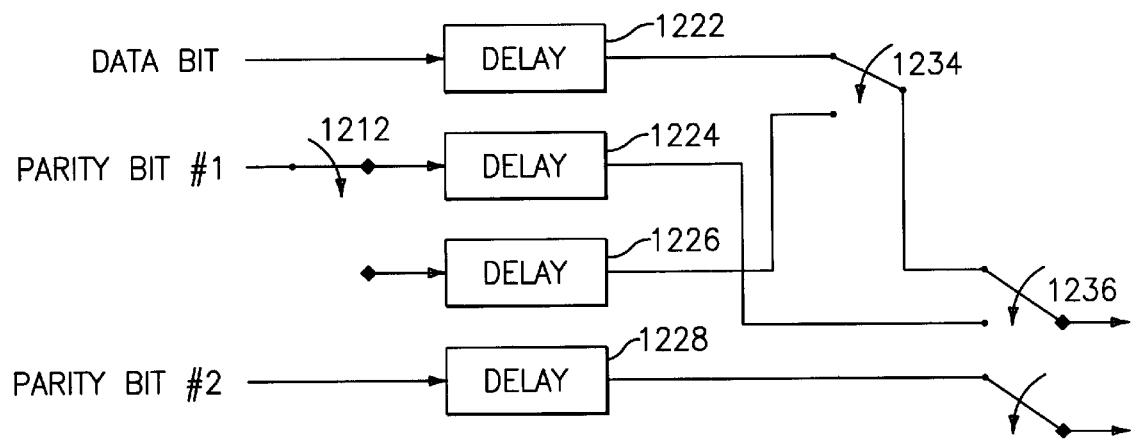
FIG. 12 is a detailed diagram illustrating a multiplexer of FIG. 10.

FIG. 12 is a diagram illustrating the multiplexer 1050. Referring to FIG. 12, the multiplexer 1050 first receives the 24 data bits $I_k$ output from the bit inserter 1010. A delay 1222 in the multiplexer 1050 then stores the received 24 data bits $I_k$.

Thereafter, the multiplexer 1050 receives the 28 first parity bits $C_k$ output from the first constituent encoder 1020. A switch 1212 in the multiplexer 1050 then is connected to a delay 1224 until the first 24 bits out of the first parity bits $C_k$ are received from the first constituent encoder 1020, and the delay 1224 stores the received first parity bits $C_k$. Subsequently, the switch 1212 is connected to a delay 1226 until the remaining 8 bits out of the 32 first parity bits $C_k$ are received from the first constituent encoder 1020, and the delay 1226 stores the remaining 8 bits of the first parity bits $C_k$.

Next, the multiplexer 1050 receives the 24 second parity bits $D_k$ output from the second constituent encoder 1040. A delay 1228 in the multiplexer 1050 then stores the received 24 second parity bits $D_k$.

Such sequentially generated 24 data bits $I_k$, 28 first parity bits $C_k$ and 24 second parity bits $D_k$ are applied to the multiplexer 1050. The multiplexer 1050 then stores the sequentially received data bits $I_k$, first parity bits $C_k$ and second parity bits $D_k$ in corresponding delays in the order of reception, wherein the first 24 bits and the remaining 4 bits out of the 28 first parity bits $C_k$ are separately stored in the corresponding delays. The delays 1222–1228 each are composed of cascaded memory elements and store the corresponding input bits until the above delay process is completed.

After the above delay process, a switch 1236 is connected to a switch 1234, and the switch 1234 is connected to delay 1222. Thus, an output of the delay 1222 is output via the switches 1234 and 1236. When one data bit stored in the delay 1222 is output, the switch 1234 is connected to the delay 1226, maintaining connection with the switch 1236. Then, one of the remaining first parity bits stored in the delay 1226 is output via the switches 1234 and 1236. That is, the data bit store in the delay 1222 is punctured and then, the first parity bit stored in the delay 1226 is inserted in the punctured position. Thereafter, the switch 1234 is connected again to the delay 1222, maintaining connection with the switch 1236. The above operation is repeated 8 times to puncture the data bits stored in the 1222 and insert in the punctured positions the remaining 8 first parity bits stored in the delay 1226. As a result, the 24 data bits $I_k$ are punctured to insert the 8 first parity bits in the punctured positions (i.e., bit insert positions), thereby outputting 24 bits.

Thereafter, the switch 1236 is connected to an output of the delay 1224. Then, the 24 first parity bits $C_k$ stored in the delay 1224 are output via the switch 1236. Next, the switch 1236 is switched to the delay 1228 to output the 24 second parity bits $D_k$ stored in the delay 1228.

Figure 13:
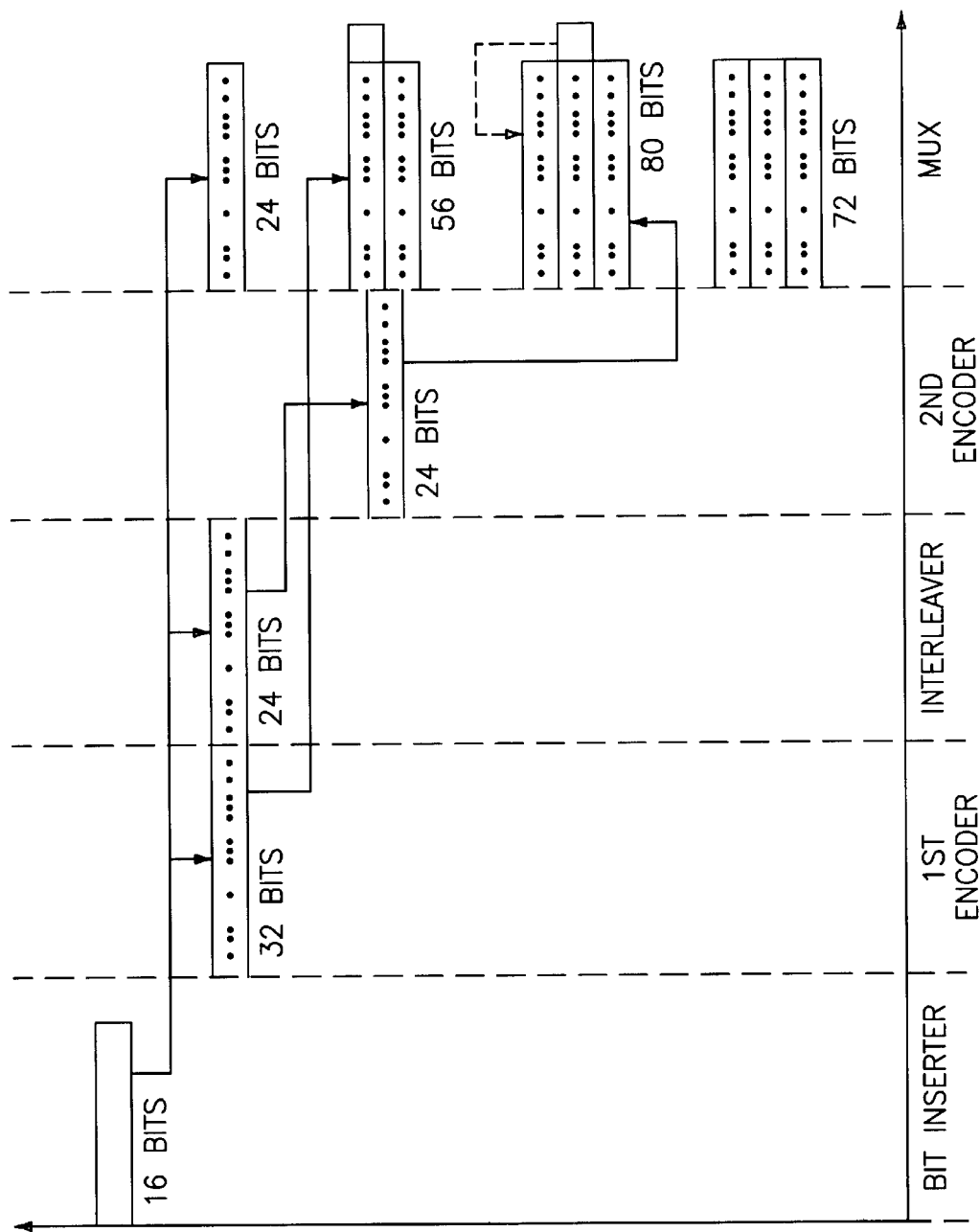
FIG. 13 is a diagram illustrating a bit processing procedure according to a third embodiment of the present invention.

Referring to FIG. 13, in the encoder of FIG. 10 according to the third embodiment, the bit inserter 1010 inserts 8 bits in the 16 input data bits to generate the 24 data bits $I_k$. A recursive systemic constituent encoder which generates the tail bits, is used for the constituent encoder. In this case, the constituent encoder generates 32 data bits in total, composed of 24 encoded data bits, 4 tail bits and encoded data of the 4 tail bits. When outputting the encoded data bits, the input data bits $I_k$ are punctured to insert the remaining 8 first parity bits in the bit punctured positions.

In the decoding process, the output values of the multiplexer 1050 are demultiplexed into a data bit portion, a first parity bit portion and a second parity bit portion, wherein the data bit portion is punctured with a value of "−5" at the bit inserting portion. Such processed data bits are decoded by an existing decoder. (See Claude Berrou, Alain Glavieux and Punya Thitmajshima "Near Shannon Limit Error-Correction Coding and Decoding: Turbo-Codes (1)".)

Although it is assumed that this embodiment uses the zero bits as the insert bits, it is also possible to use encoded bits or data bits predetermined with the receiver.

Fourth Embodiment

As described in the first to third embodiments, bit inserting is performed under a previous engagement between a transmitter and a receiver. That is, the transmitter inserts specific bits in frame data at predetermined bit insert positions before channel encoding, and the receiver performs decoding for the received channel coded symbols, having prior knowledge of the bit-inserted positions. Therefore, the receiver can improve performance utilizing information about the bit-insert positions in the decoding process. In this embodiment, symbols having specific values are inserted at the bit insert positions to increase channel decoding performance. Further, after insertion of the symbols at the bit insert positions, the symbols located at the bit insert positions are initialized to a specific value in each iterative decoding process to perform channel decoding. The symbols output from a demultiplexer having a reverse operation of the multiplexers are decoded in the following decoding process. Herein, the demultiplexer demultiplexes received channel coded symbols to generate data symbol Xk, first parity symbol Y1k and second parity symbol Y2k.

Figure 14:
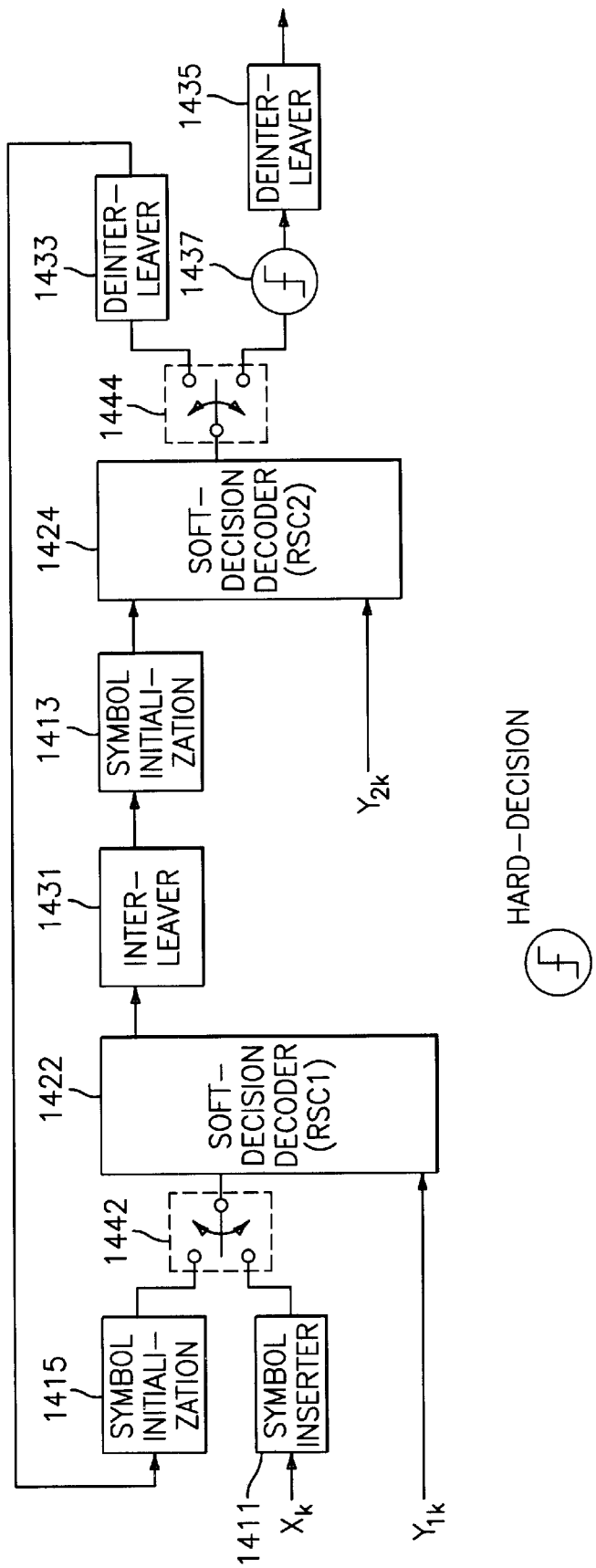
FIG. 14 is a diagram illustrating a channel decoder according to an embodiment of the present invention.

FIG. 14 illustrates a decoder for decoding channel coded symbols transmitted from an encoder according to the first to third embodiments. For simplicity, FIG. 14 does not illustrate the demultiplexer for demultiplexing received channel coded symbols.

Referring to FIG. 14, a symbol inserter 1411 receives the demultiplexed data symbols Xk. For a symbol located at a non-bit insert position, the symbol inserter 1411 outputs the received symbol to a soft-decision decoder 1422, as it is; otherwise, for a symbol located at a bit insert position, the symbol inserter 1411 selects a symbol having a specific value generated by an internal symbol generator and outputs the selected symbol to the soft-decision decoder 1422. That is, the symbol inserter 1411 inserts an internally generated symbol of a specific value at a position where a specific bit is inserted as shown in Table 4, and outputs the received data symbols, as they are, at the original data symbol positions. Here, since the insert positions of the specific bit are previously scheduled between the transmitter and the receiver, the receiver previously knows the insert positions of the specific bit for the data symbol. A symbol initializer 1415 receives symbols fed back from a deinterleaver 1433, for iterative decoding. The symbol initializer 1415 initializes a symbol located at the bit insert position to a specific value and outputs other symbols as they are. A switch 1442 selects one of the symbols output from either the symbol inserter 1411 or the symbol initializer 1415, depending on the switch position. More specifically, the switch 1442 selects the output of the symbol inserter 1411 upon receipt of a data symbol Xk, and otherwise selects the output of the symbol initializer 1415. The soft-decision decoder 1422 receives the symbols output from the switch 1442 and the first parity symbol Y1k output from the demultiplexer, and performs soft-decision decoding for the received symbols. Here, an output value of the soft-decision decoder 1422 becomes additional information.

An interleaver 1431 interleaves an output of the soft-decision decoder 1422. A symbol initializer 1413 receiving the interleaved decoded data from the interleaver 1413, initializes a symbol located at the bit insert position to the specific value (e.g., −5) and otherwise, outputs symbols at non-bit insert positions, as they are. A soft-decision decoder 1424 decodes an output of the symbol initializer 1413 and the second parity bit Y2k.

A switch 1444 switches the decoded data output from the soft-decision decoder 1424 to the deinterleavers 1433 or a hard-decision element 1437. The deinterleaver 1433 deinterleaves the decoded data output from the soft-decision decoder 1424 and feeds the deinterleaved data back to the symbol initializer 1415. The hard-decision element 1437 performs hard-decision for the decoded data output from the switch 1444. A deinterleaver 1435 deinterleaves an output of the hard-decision element 1437.

The soft-decision decoders 1422 and 1424 each can be comprised of a constituent encoder, which is well disclosed in Claude Berrou, Alain Glavieux and Punya Thitrnajshima "Near Shannon Limit Error-Correction Coding and Decoding: Turbo-Codes (1)", and U.S. Pat. No. 5,446,747 issued to Berrou.

The symbol inserter 1411 may have the same structure as that of the bit inserter 310 of FIG. 4.

Figure 15:
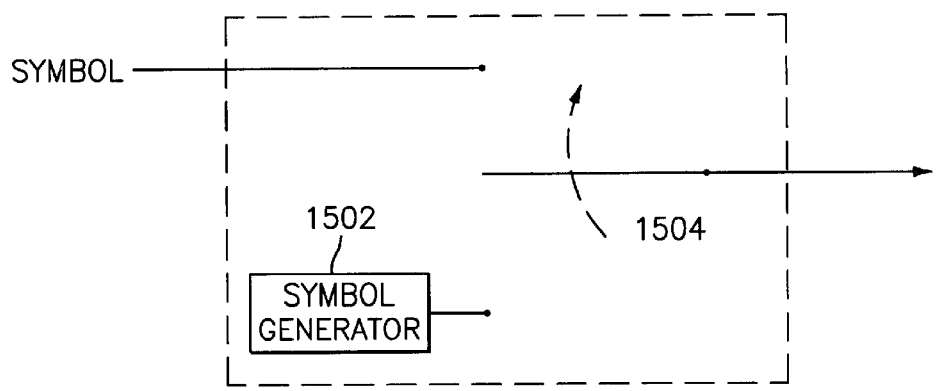
FIG. 15 is a detailed diagram illustrating a symbol initializer of FIG. 14.

FIG. 15 illustrates the symbol initializers 1413 and 1415, wherein a symbol generator 1502 generates a symbol having a specific symbol value for increasing reliability of an inserted bit. In this embodiment, the specific symbol value is assumed to be −5. A switch 1504 is switched at a specific bit-inserted position to select the output of the symbol generator 1502 and selects the input symbols at other symbol positions. Further, the switch 1442 connects the symbol inserter 1411 to the soft-decision decoder 1422 upon receipt of first symbol data, and connects the symbol initializer 1415 to the soft-decision decoder 1422 during iterative decoding. Further, the switch 1444 connects the soft-decision decoder 1424 to the deinterleaver 1433 during iterative decoding, and connects the soft-decision decoder 1424 to the hard-decision element 1437 upon completion of iterative decoding.

In operation, as the channel coded symbols Xk, Y1k and Y2k each having a value of +1 or −1 are input to the channel decoder, the symbol inserter 1411 receiving the data symbol Xk, inserts a specific value (e.g. −5) at a bit insert position punctured during channel encoding. In this embodiment, the specific value is assumed to be −5 which is inclined to −1, and a symbol having the specific value is inserted at the insert position. At this point, the switch 1442 connects the symbol inserter 1411 to the soft-decision decoder 1422. At this point, the switch 1442 connects the symbol inserter 1411 to the soft-decision decoder 1422. That is, the switch 1442 connects an output of the symbol inserter 1411 to the soft-decision decoder 1422 at a data symbol input duration, and connects an output of the symbol initializer 1415 to the soft-decision decoder 1422 at an iterative decoding duration. The symbol inserter 1411 then analyzes the received data symbols, to output an internally generated symbol having the specific value (e.g., −5) at the specific bit-inserted position and output the data symbol Xk at other positions where the specific bits are not inserted. The soft-decision decoder 1422 decodes the data symbol Xk and the first parity symbol Y1k, calculates a ratio of a probability that a data bit for the symbols before encoding is 0 to a probability that the data bit is 1, and outputs a corrected value of the data symbol Xk as a decoded symbol based on the calculated value.

The symbols output from the soft-decision decoder 1422 are interleaved by the interleaver 1431 and then applied to the symbol initializer 1413. When the symbols located at the insert position, decoded by the soft-decision decoder 1422, has a value (e.g., −3.1) which is inclined to −1 from −5, the symbol initializer 1413 restores the value to −5.

Referring to FIG. 15, upon receipt of symbols, the switch 1504 of the symbol initializer 1413 connects the output of the interleaver 1431 to the soft-decision decoder 1424 to output input symbols, as they are. In the meantime, at a puncturing position, the switch 1504 is switched to the symbol generator 1502. At this point, the symbol generator 1502 generates a value of −5, which is output through the switch 1504. Thereafter, the switch 1504 in the symbol initializer 1413 connects again the interleaver 1431 to the soft-decision decoder 1424 to output the input symbols, as they are. After the symbols located at the insert positions are initialized to −5 by the symbol initializer 1413, the output symbols together with the second parity bit Y2k undergo soft-decision decoding by the soft-decision decoder 1424.

The soft-decision decoder 1424 has the same operation as that of the soft-decision decoder 1422, except for the sequence of the input symbols. At this point, the switch 1444 connects the soft-decision decoder 1424 to the deinterleaver 1433 to output the symbols decoded by the soft-decision decoder 1424 as the output of the deinterleaver 1433. The deinterleaver 1433 then deinterleaves the input decoded data and feeds the deinterleaved data back to the symbol initializer 1415, which initializes again the symbols located at the insert positions out of the output symbols of the deinterleaver 1433 to −5. The symbol initializer 1415 having the same operation as that of the symbol initializer 1413 except the sequence of the symbols fed back, initializes the symbols at the insert positions. At this point, the switch 1442 connects the symbol initializer 1415 to the soft-decision decoder 1422 to input the initialized symbols to the soft-decision decoder 1422, in order to repeat the above described operations.

After repeating the above operations predetermined times, when the decoded symbol is output from the soft-decision decoder 1424, the switch 1444 connects the soft-decision decoder 1424 to the hard-decision element 1437. The decoded symbols are decided as values of 1 and 0 by the hard-decision element 1437, and deinterleaved by the deinterleaver 1435 to be output as final decoded bits.

Figure 16:
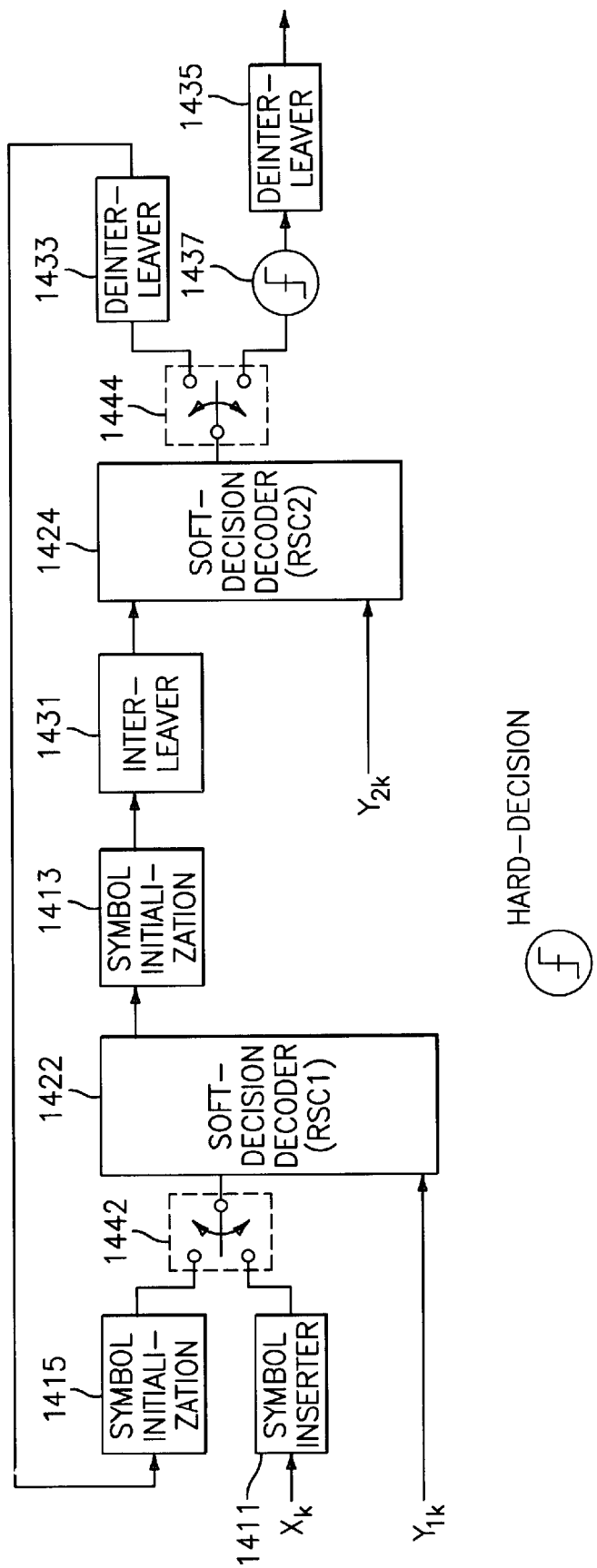
FIG. 16 is a detailed diagram illustrating a channel decoder according to another embodiment of the present invention.

FIG. 16 illustrates a decoder according to another embodiment of the present invention. As can be understood, the decoder has the same structure as that of the decoder of FIG. 14, except the sequence of the interleaver 1431 and the symbol initializer 1413.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A channel decoding device for a receiver which receives symbols coded after inserting at least one specific bit in a data frame at predetermined positions, the device comprising:

a demultiplexer receiving the symbols, for demultiplexing the received symbols into data symbols, first parity symbols and second parity symbols;

a symbol inserter for inserting symbols having a specific value at predetermined insert positions within the data symbols and outputting the received symbols at other positions;

a first decoder for decoding the data symbols output from the symbol inserter and the first parity symbols to generate first decoded symbols;

an interleaver for interleaving an output of the first decoder;

a second decoder for decoding the first decoded symbols output from the interleaver and the second parity symbols to generate second decoded symbols; and a deinterleaver for deinterleaving an output of the second decoder.

2. The channel decoding device as claimed in claim 1, further comprising:

a first symbol initializer for changing, to the specific value, corresponding symbols at positions where the symbols are inserted by the symbol inserter during iterative decoding;

a first selector connected to the symbol inserter and the first symbol initializer, for selecting an output of the symbol inserter when the data symbols are received, and selecting an output of the first symbol initializer during iterative decoding, to output the selected value to the first decoder;

a second deinterleaver for deinterleaving the second decoded symbols during iterative decoding to feed the deinterleaved symbols back to the first symbol initializer; and a second selector connected to the second decoder, for outputting an output of the second decoder to the second deinterleaver during iterative decoding.

3. The channel decoding device as claimed in claim 2, further comprising a second symbol initializer connected between the interleaver and the second decoder, for changing, to the specific value, corresponding interleaved first decoded symbols at positions where symbols having the specific value are inserted.

4. The channel decoding device as claimed in claim 2, further comprising a second symbol initializer connected between the first decoder and the interleaver, for changing, to the specific value, corresponding first decoded symbols at positions where symbols having the specific value are inserted.

5. The channel decoding device as claimed in claim 2, further comprising a hard-decision element connected between the second decoder and the deinterleaver, for performing a hard-decision for the second decoded symbols.

6. A channel decoding method for a receiver which receives symbols coded after inserting at least one specific bit in a data frame at predetermined positions, the method comprising the steps of:

a) receiving the symbols;

b) demultiplexing the received symbols into data symbols, first parity symbols and second parity symbols;

c) inserting symbols having a specific value at predetermined insert positions within the data symbols and outputting the received symbols at other positions;

d) decoding the data symbols, having the specific value inserted, and first parity symbols to generate first decoded symbols;

e) interleaving the first decoded symbols;

f) decoding the interleaved first decoded symbols and the second parity symbols to generate second decoded symbols; and g) deinterleaving the second decoded symbols.

7. The channel decoding method as claimed in claim 6, further comprising the steps of:

changing a corresponding symbol of the deinterleaved second decoded symbols to the specific value at an insert position, and repeating steps (c) through (e);

upon completion of steps (c) through (e), performing a hard- decision for the second decoded symbols; and deinterleaving the hard-decision processed second decoded symbols.

8. A channel decoding method for a receiver which receives symbols coded after inserting at least one specific bit in a data frame at predetermined positions, the method comprising the steps of:

a) receiving the symbols of the frame and changing symbols of the received symbols positioned at the predetermined positions into a specific value;

b) decoding the received symbols including symbols having the specific value;

c) changing the inserted symbols of fed-back symbols to the specific value, and repeating step (b); and d) upon completion of step (c), outputting the decoded data.

9. A channel decoding device for a receiver in a mobile communication system for decoding a turbo encoded signal transmitted from a transmitter, wherein the transmitter includes a bit inserter for inserting at least one specific bit at a predetermined position within a received information bit stream, and a turbo encoder for encoding the specific bit inserted information bit stream into data symbols, first parity symbols and second parity symbols, the device comprising:

a demultiplexer receiving the turbo encoded symbols, for demultiplexing the received symbols into data symbols, first parity symbols and second parity symbols;

a symbol inserter for changing a symbol having a specific value at a predetermined specific bit insert position of the data symbols and outputting the received symbols at other positions;

a first decoder for decoding the data symbols output from the symbol inserter and the first parity symbols to generate first decoded symbols;

an interleaver for interleaving an output of the first decoder;

a second decoder for decoding the first decoded symbols output from the interleaver and the second parity symbols to generate second decoded symbols; and a deinterleaver for deinterleaving the second decoded symbols to generate decoded data.

10. The channel decoding device as claimed in claim 9, further comprising:

a symbol initializer for initializing, to the specific value, symbols inserted at an insert position during iterative decoding;

a first selector connected to one of the symbol inserter and the symbol initializer, for selecting an output of the symbol inserter when the data symbols are received, and selecting an output of the symbol initializer during iterative decoding, to output the selected value to the first decoder;

a second deinterleaver for deinterleaving the second decoded symbols during iterative decoding to feed the deinterleaved symbols back to the first symbol initializer; and a second selector connected to the second decoder, for outputting an output of the second decoder to the second deinterleaver during iterative decoding.

11. The channel decoding device as claimed in claim 10, further comprising:

a second symbol initializer connected between the second decoder and the interleaver, for changing, to the specific value, corresponding first decoded symbols at positions where a symbol having the specific value is inserted.

12. The channel decoding device as claimed in claim 10, further comprising:

a second symbol initializer connected between the first decoder and the interleaver, for changing, to the specific value, corresponding first decoded symbols at positions where symbols having the specific value are inserted.

13. The channel decoding device as claimed in claim 10, further comprising a hard-decision element connected between the second decoder and the deinterleaver, for performing a hard-decision for the second decoded symbols.

14. The channel decoding device as claimed in claim 10, wherein the specific bit insert position has a higher error probability within a frame during channel decoding.

15. A channel decoding method for a receiver in a mobile communication system for decoding a turbo encoded signal transmitted from a transmitter, wherein the transmitter includes a bit inserter for inserting at least one specific bit at a predetermined position within a received information bit stream, and a turbo encoder that encodes the specific bit inserted information bit stream into data symbols, first parity symbols and second parity symbols, the method comprising the steps of:

a) receiving the turbo encoded signal;

b) demultiplexing the received symbols into the data symbols, the first parity symbols and the second parity symbols;

c) changing a symbol having a specific value at a predetermined specific bit insert position of the data symbols and outputting the received symbols at other bit positions;

d) decoding the data symbols at symbol positions having the specific value inserted and the first parity symbols to generate first decoded symbols;

e) interleaving the first decoded symbols;

f) decoding the interleaved first decoded symbols and the second parity symbols to generate second decoded symbols; and g) deinterleaving the second decoded symbols.

16. The channel decoding method as claimed in claim 15, further comprising the steps of:

changing corresponding symbols of the deinterleaved second symbols to the specific value at an insert position, and repeating steps (c) through (e);

upon completion of steps (c) through (e), performing a hard-decision for the second decoded symbols; and deinterleaving the hard-decision processed second decoded symbols.

17. A turbo encoding and decoding apparatus, comprising:

the turbo encoding apparatus comprising:

a bit inserter for inserting at least one bit at a predetermined position of a received data bit stream;

a first encoder for encoding the data bit stream at positions where the bits are inserted to generate a first parity symbol stream;

an interleaver for interleaving the data bit stream;

a second encoder for encoding the output of the interleaver to generate a second parity symbol stream; and a multiplexer for multiplexing outputs of the bit inserter, the first encoder and the second encoder to output a channel-coded symbol stream; and the turbo decoding apparatus comprising:

a demultiplexer for receiving the channel-coded symbols and demultiplexing data symbols, first parity symbols and second parity symbols;

a first decoder for decoding data symbols output from the demultiplexer and the first parity symbols to generate first decoded symbols;

an interleaver for interleaving an output of the first decoder;

a second decoder for decoding the first decoded symbols output from the interleaver and the second parity symbols to generate second decoded symbols; and a deinterleaver for deinterleaving the second decoded symbols to generate decoded data.

\* \* \* \* \*